(12) United States Patent
Rasbornig et al.

(10) Patent No.: US 9,874,609 B2
(45) Date of Patent: Jan. 23, 2018

(54) SENSOR SELF-DIAGNOSTICS USING MULTIPLE SIGNAL PATHS

(71) Applicant: Infineon Technologies AG, Neubiberg (DE)

(72) Inventors: Friedrich Rasbornig, Klagenfurt (AT); Mario Motz, Wernberg (AT); Wolfgang Scherr, Villach (AT); Wolfgang Granig, Seeboden (AT); Michael Strasser, Villach (AT); Bernhard Schaffer, Villach (AT); Gerhard Pircher, Villach (AT); Ferdinand Gastinger, Woelfnitz (AT); Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 688 days.

(21) Appl. No.: 13/833,852

(22) Filed: Mar. 15, 2013

(65) Prior Publication Data

US 2013/0200909 A1 Aug. 8, 2013

Related U.S. Application Data

(63) Continuation-in-part of application No. 12/889,749, filed on Sep. 24, 2010, now Pat. No. 9,346,441.

(51) Int. Cl.
*G01R 31/3187* (2006.01)
*B60T 8/88* (2006.01)
(Continued)

(52) U.S. Cl.
CPC .......... *G01R 31/3187* (2013.01); *B60T 8/885* (2013.01); *B60W 50/0205* (2013.01);
(Continued)

(58) Field of Classification Search
CPC ... B60W 50/023; G01R 31/3187; B60T 8/885
(Continued)

(56) References Cited

U.S. PATENT DOCUMENTS

| | | | | |
|---|---|---|---|---|
| 4,113,321 A | * | 9/1978 | Bleckmann | ............. B60T 8/885 303/122.07 |
| 4,692,299 A | * | 9/1987 | Crew | ....................... G05B 9/03 376/216 |

(Continued)

FOREIGN PATENT DOCUMENTS

| | | |
|---|---|---|
| CN | 101073231 A | 11/2007 |
| CN | 101713673 A | 5/2010 |

(Continued)

OTHER PUBLICATIONS

Dilger et al., On a redundant Diversified Steering Angle Sensor, © 2003, Proceedings of the 9$^{th}$ IEEE International On-Line Testing Symposium, 6 pages.

(Continued)

*Primary Examiner* — Patrick Assouad
*Assistant Examiner* — Demetrius Pretlow
(74) *Attorney, Agent, or Firm* — Schiff Hardin LLP

(57) ABSTRACT

Embodiments relate to systems and methods for self-diagnostics and/or error detection using multiple signal paths in sensor and other systems. In an embodiment, a sensor system comprises at least two sensors, such as magnetic field sensors, and separate signal paths associated with each of the sensors. A first signal path can be coupled to a first sensor and a first digital signal processor (DSP), and a second signal path can be coupled to a second sensor and a second DSP. A signal from the first DSP can be compared with a signal from the second DSP, either on-chip or off, to detect faults, errors, or other information related to the operation of the sensor system. Embodiments of these systems and/or (Continued)

methods can be configured to meet or exceed relevant safety or other industry standards, such as safety integrity level (SIL) standards.

32 Claims, 5 Drawing Sheets

(51) Int. Cl.
*G01D 3/08* (2006.01)
*B60W 50/02* (2012.01)
*G01R 31/00* (2006.01)
*G01R 31/28* (2006.01)
*B60W 50/00* (2006.01)

(52) U.S. Cl.
CPC ............ *G01D 3/08* (2013.01); *B60T 2250/06* (2013.01); *B60T 2270/406* (2013.01); *B60T 2270/411* (2013.01); *B60T 2270/413* (2013.01); *B60W 2050/0047* (2013.01); *B60W 2050/0215* (2013.01); *G01R 31/007* (2013.01); *G01R 31/2829* (2013.01)

(58) Field of Classification Search
USPC ...................................................... 324/750.3
See application file for complete search history.

(56) References Cited

U.S. PATENT DOCUMENTS

| | | | |
|---|---|---|---|
| 4,804,515 A * | 2/1989 | Crew ...................... | G06F 11/16 376/215 |
| 5,343,404 A * | 8/1994 | Girgis .................. | G01R 15/125 324/623 |
| 5,495,427 A * | 2/1996 | Puma ....................... | G01S 5/30 340/870.41 |
| 5,965,819 A * | 10/1999 | Piety ...................... | G01N 29/44 702/56 |
| 6,167,547 A * | 12/2000 | Senechal et al. ............ | 714/732 |
| 6,225,802 B1 | 5/2001 | Rarnalho | |
| 6,340,884 B1 | 1/2002 | Wolf | |
| 6,449,567 B1 | 9/2002 | Desai | |
| 6,564,637 B1 | 5/2003 | Schalk et al. | |
| 7,086,270 B2 | 8/2006 | Weinberg et al. | |
| 7,127,932 B2 | 10/2006 | Morell | |
| 7,372,248 B2 | 5/2008 | Barthel | |
| 7,565,602 B2 * | 7/2009 | Ausserlechner ............. | 714/807 |
| 2002/0050933 A1 * | 5/2002 | Donat et al. ............ | 340/870.21 |
| 2002/0067255 A1 | 6/2002 | Tanizawa | |
| 2004/0095218 A1 | 5/2004 | Wan et al. | |
| 2004/0254711 A1 * | 12/2004 | Zumberge et al. ............. | 701/76 |
| 2005/0124136 A1 | 6/2005 | Piguet et al. | |
| 2005/0216134 A1 | 9/2005 | Katrak | |
| 2006/0049823 A1 * | 3/2006 | Suzuki ............... | G01R 31/2829 324/202 |
| 2006/0220634 A1 * | 10/2006 | Ito .......................... | G05F 3/222 323/313 |
| 2006/0267756 A1 * | 11/2006 | Kates .......................... | 340/521 |
| 2007/0010967 A1 * | 1/2007 | Scherr .......................... | 702/182 |
| 2007/0150225 A1 * | 6/2007 | Boerstler ............... | G01K 1/026 702/132 |
| 2007/0200564 A1 * | 8/2007 | Motz et al. ................... | 324/247 |
| 2007/0247141 A1 | 10/2007 | Pastre et al. | |
| 2007/0260383 A1 | 11/2007 | Sundaram | |
| 2007/0279044 A1 | 12/2007 | Rossmann | |
| 2007/0282459 A1 * | 12/2007 | Schafer et al. ................... | 700/4 |
| 2008/0012557 A1 | 1/2008 | Hammerschmidt | |
| 2008/0173518 A1 | 7/2008 | Klusemann | |
| 2008/0245145 A1 | 10/2008 | Mayer | |
| 2009/0112418 A1 | 4/2009 | Buur | |
| 2009/0115468 A1 * | 5/2009 | Berthold .......... | H03K 3/356156 327/141 |
| 2009/0128160 A1 | 5/2009 | Chiaburu | |
| 2009/0278711 A1 * | 11/2009 | Lohberg et al. ................ | 341/11 |
| 2010/0097088 A1 | 4/2010 | Uemura | |
| 2010/0147124 A1 | 6/2010 | Seidel | |
| 2012/0016623 A1 | 1/2012 | Hayner | |
| 2012/0074972 A1 | 3/2012 | Rasbornig | |
| 2012/0249170 A1 | 10/2012 | Baumann | |
| 2012/0262196 A1 | 10/2012 | Yokou | |
| 2013/0049780 A1 | 2/2013 | Collins | |
| 2013/0076383 A1 | 3/2013 | Poinstingl | |
| 2013/0200909 A1 | 8/2013 | Rasbornig | |
| 2013/0314075 A1 | 11/2013 | Ausserlechner | |

FOREIGN PATENT DOCUMENTS

| | | |
|---|---|---|
| CN | 102402465 A | 4/2012 |
| CN | 102419403 A | 4/2012 |
| CN | 102695943 A | 9/2012 |
| DE | 102004044335 A1 * | 4/2006 |
| WO | WO 2005/083449 A3 | 9/2005 |
| WO | WO 2005/085892 | 9/2005 |
| WO | WO-2009/047812 A1 | 4/2009 |

OTHER PUBLICATIONS

Torres-Echevernia et al., ScienceDirect, "Design Optimization of a Safety-Instrumented System Based on RAMS+C addressing IEC 61508 Requirements and Diverse Redundancy", 2009, Reliability Engineering & System Safety 94, pp. 162-179.

Suyama, Koichi, "Functional Safety Analysis of Reliable Control Systems Using Decision by Majority", Jun. 1999, Proceedings of the American Control Conference, pp. 618-621.

Pastre et al., "A Hall Sensor Analog Front End for Current Measurement with Continuous Gain Calibration," *IEEE Sensors Journal*, vol. 7, No. 5, May 2007, pp. 860-867.

Application and File History for U.S. Appl. No. 12/889,749, filed Sep. 24, 2010, inventors: Rasbornig et al.

National Instruments, *What is the ISO 26262 Functional Safety Standard?*, Published Feb. 23, 2012, as available at www.ni.com, 4 pages.

Ramirez, Edgar C., *Diverse Redundancy Used in SIS Technology to Achieve Higher Safety Integrity*, dated May 8, 2008, 9 pages.

Endress + Hauser, *FAQs about Functional Safety*, © 2013, http://www.endress.com/eh/home.nsf/#products/~product-instrument-sil-functional-safety-faq-questions, 9 pages.

International Electrotechnical Commission, http://www.iec.ch/functionalsafety/faci-ed2, 9 pages, © 2014.

Wikipedia, *ISO26262*, available at http://en.wikipedia.org/wiki/ISO_26262 on Mar. 3, 2014, 6 pages.

Infineon, *Innovative Semiconductor Solutions for Safety Applications*, © 1999-2014, 4 pages.

Office Action dated Dec. 8, 2015 for Chinese Patent Application No. 201410097855.0.

* cited by examiner

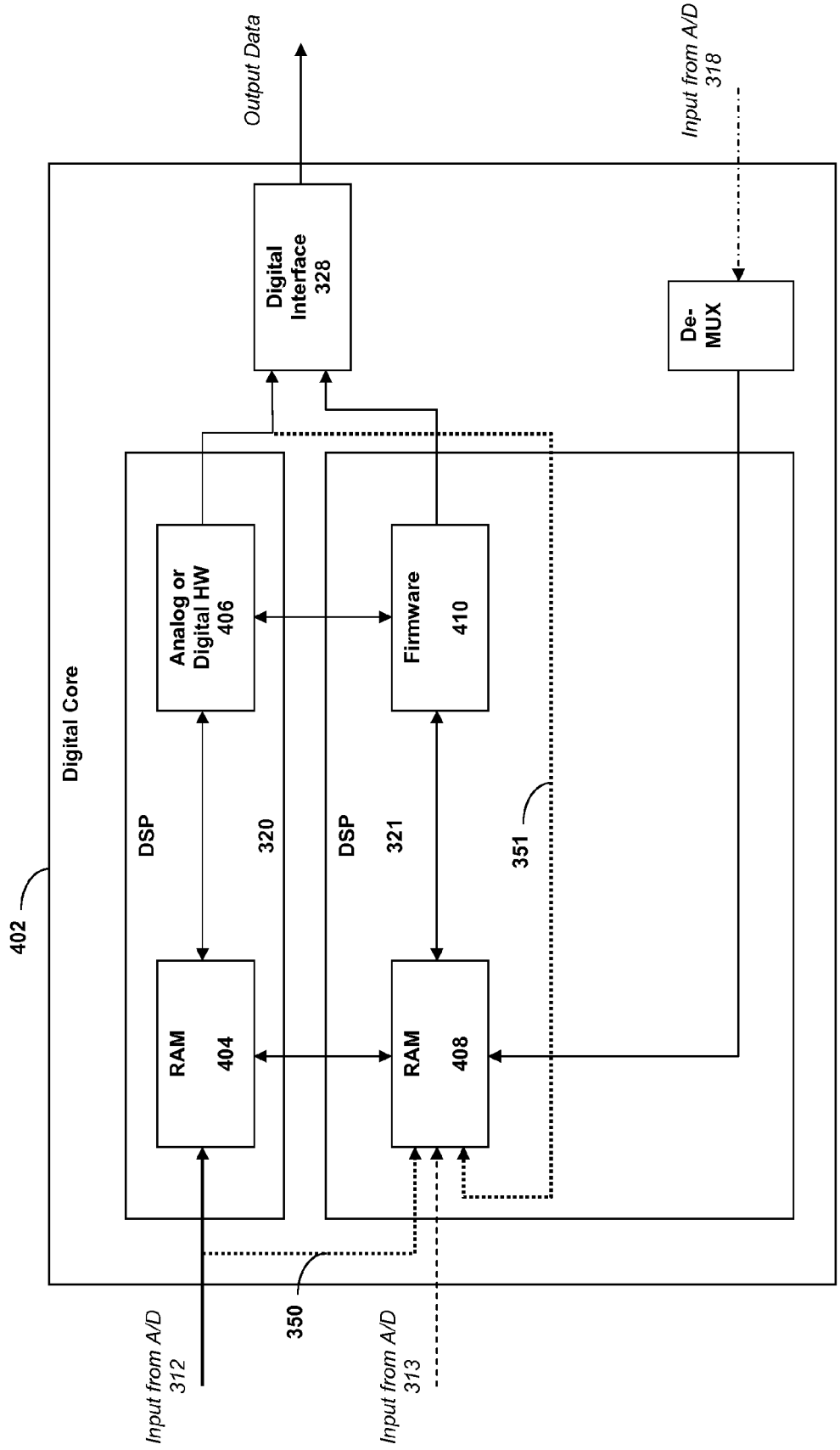

SENSOR SELF-DIAGNOSTICS USING MULTIPLE SIGNAL PATHS

RELATED APPLICATION

This application is a continuation-in-part (CIP) of U.S. application Ser. No. 12/889,749 filed Sep. 24, 2010, which is incorporated herein by reference in its entirety.

TECHNICAL FIELD

The invention relates generally to integrated circuit (IC) sensors and more particularly to IC sensor self-diagnostics using multiple communication signal paths.

BACKGROUND

A recent trend in automobile drive technology, as part of developments in the automobile electronics sector, is for established passive safety systems like seatbelts and airbags to be extended by active safety systems, such as anti-lock braking systems (ABS), electronic stability programs (ESP) and electrical steering systems, to provide an increasing range of driver assistance functionalities. As has already been the case in the drive train for some time, system complexity is also continuously increasing here in order to detect hazardous driving situations and contribute to accident avoidance through active interventions by a control system. With ongoing technological advances, these trends are expected to continue and grow stronger in the future.

The resulting significant increase in the number of electronic components with a safety-related functionality has given rise to previously unprecedented requirements in terms of reliability and system availability. In order to be able to achieve this while at the same time meeting cost objectives, it is desired to develop efficient methods for functional self-monitoring through integrated test methods along with redundancies. At the same time, progress is desired in design methodologies in order to be able to identify and avoid possible weaknesses in safety systems early on. In the area of magnetic field sensors, for example, this has been done by the introduction of the Safety Integrity Level (SIL) standard.

In order to meet SIL standards in the automotive field, it is desired to implement and use corresponding self-tests, including built-in self-tests, not only at start-up but also during normal operation, as well as automatic monitoring structures or corresponding redundant functional blocks and/or signal paths. Conventional magnetic sensor systems, in particular linear Hall measuring systems, have used a single-channel analog main signal path. It is technically very difficult, or perhaps even impossible, to meet the SIL requirements in safety-critical applications with this concept. It is therefore no longer possible to cover safety requirements with just one sensor system. Thus, other conventional solutions have used two identical redundant magnetic field sensors to meet SIL requirements. Obviously, a considerable drawback of these solutions is the corresponding doubling of the cost for not one but two sensors. Still other solutions propose a defined superimposed test signal outside the signal frequency rages, such as magnetic field sensors with an additional on-chip conductor loop or pressure sensors with superimposed electrostatic coupling to the sensor.

A need remains for reliable and cost-efficient sensor systems and methods, such as those that meet SIL and/or other applicable safety standards.

SUMMARY

In an embodiment, a monolithic integrated circuit sensor system comprises a first sensor device configured to sense a physical characteristic and being coupled to a first signal path comprising a first digital signal processor (DSP) for a first sensor signal on a semiconductor chip, the first DSP providing a first output signal; and a second sensor device configured to sense the same physical characteristic as the first second device and being coupled to a second signal path for a second sensor signal on the semiconductor chip, the second signal path distinct from the first signal path and comprising a second DSP, the second DSP providing a second output signal wherein a comparison of the first output signal and the second output signal can detect an error in the sensor system.

In an embodiment, a method of comparing signals in a monolithic integrated circuit sensor system comprises implementing, on a single semiconductor chip, a main signal path comprising a main sensor and a first digital signal processor (DSP); implementing, on the single semiconductor chip, a secondary signal path comprising a secondary sensor and a second DSP, the main and secondary sensors being responsive to the same physical characteristic, the secondary signal path being different from the main signal path, and the second DSP being different from the first DSP by at least one of an architecture or a function; and comparing an output signal of the first DSP with an output signal of the second DSP.

BRIEF DESCRIPTION OF THE DRAWINGS

The invention may be more completely understood in consideration of the following detailed description of various embodiments of the invention in connection with the accompanying drawings, in which:

FIG. 4 depicts a block diagram of a digital core according to the embodiment of FIG. 3.

Figure 1A:
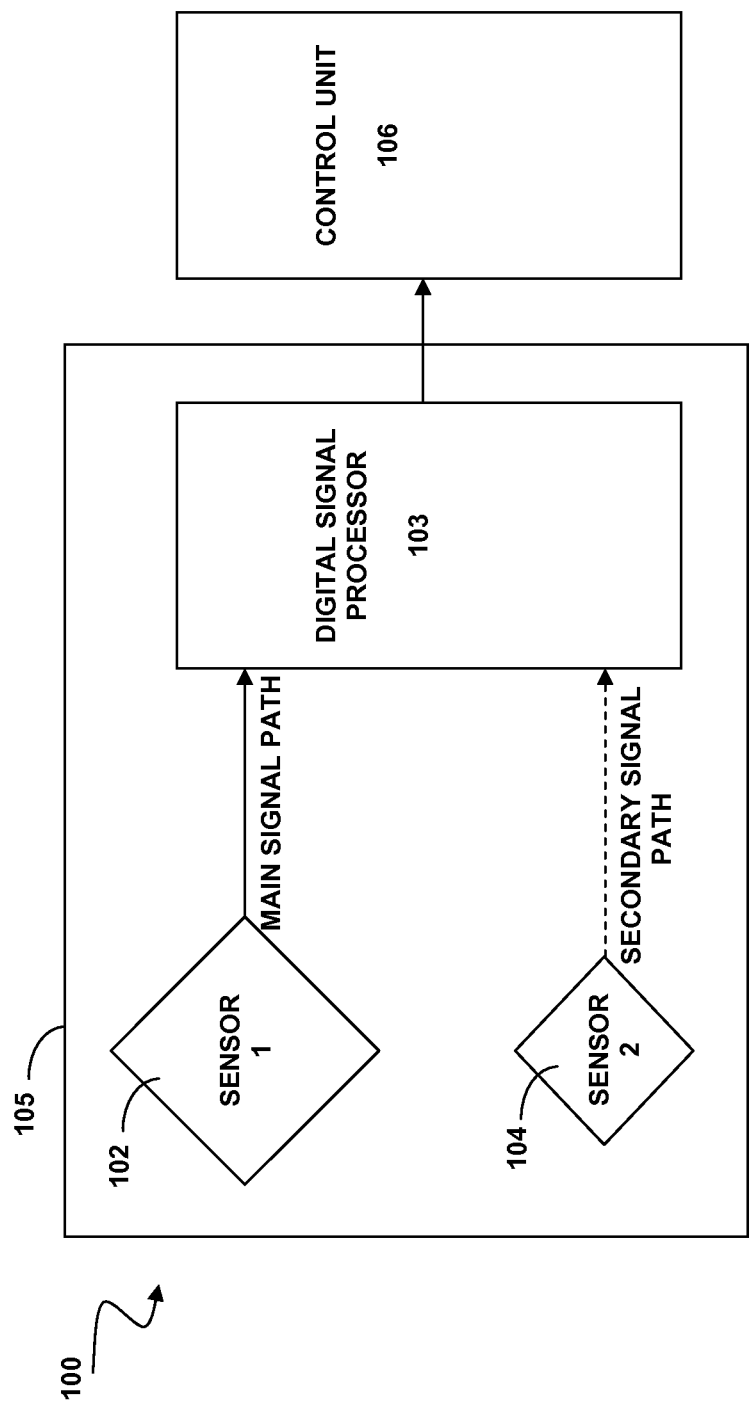
FIG. 1A depicts a system block diagram according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to systems and methods for self-diagnostics and/or error detection using multiple signal paths in sensor and other systems. In an embodiment, a sensor system comprises at least two sensors, such as magnetic field sensors, and separate signal paths associated with each of the sensors. A first signal path can be coupled to a first sensor and a first digital signal processor (DSP), and a second signal path can be coupled to a second sensor and a second DSP. A signal from the first DSP can be compared with a signal from the second DSP, either on-chip or off, to detect faults, errors, or other information related to the operation of the sensor system. Embodiments of these systems and/or methods can be configured to meet or exceed relevant safety or other industry standards, such as SIL standards.

SIL standards can include automotive SILs, or ASILs. SILs can be defined by the IEC 61508 standard, while ASILs can be defined by the ISO/DIS 26262 standard. These standards aim to reduce risks of failures in increasingly complex systems which can include software, hardware and other interrelated or interconnected components. There are four different levels (i.e., 1-4 for SIL and A-D of ASIL) which specify the level of risk associated with a system or component. Level 4 or D is the highest, most stringent level, with level 1 or A being the lowest, least stringent.

FIG. 1A depicts a conceptual block diagram of a sensor system 100 according to an embodiment. System 100 comprises a first sensor 102 and a second sensor 104 that each communicate with a digital signal processor (DSP) 103. In an embodiment, first sensor 102, second sensor 104 and DSP 103 comprise a monolithic integrated circuit implemented on a single chip 105, and DSP 103 communicates with an external electronic control unit (ECU) 106.

One of the sensors is a primary or main sensor. In the embodiment of FIG. 1A, sensor 102 is the main sensor, while sensor 104 is a secondary sensor. Main sensor 102 communicates with DSP 103 via a main signal path, and secondary sensor 104 communicates with DSP 103 via a secondary signal path which is at least partially distinct from the main signal path, as discussed in more detail below.

Figure 1B:
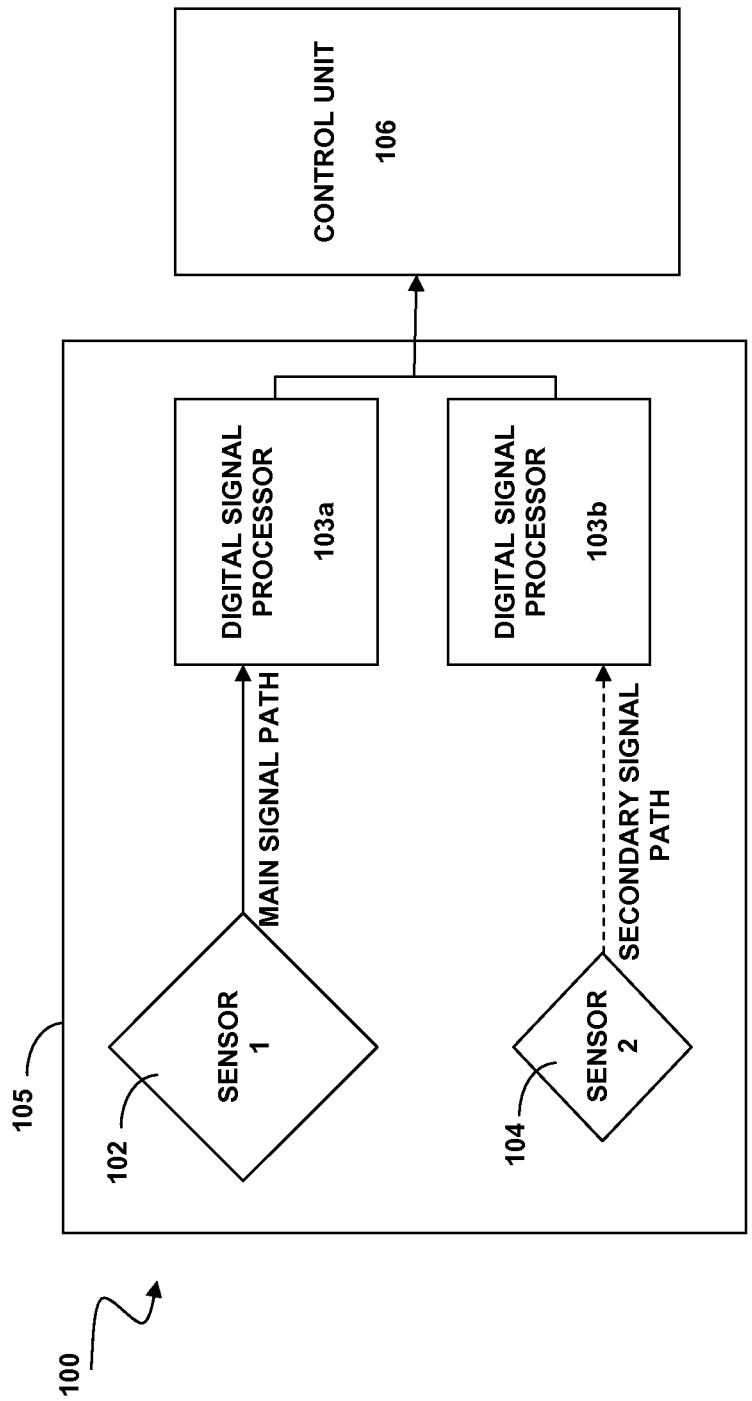
FIG. 1B depicts another system block diagram according to an embodiment.

In the embodiment of FIG. 1B, each signal path comprises a distinct DSP: the main signal path comprises a first DSP 103a, and the secondary signal path comprises a second DSP 103b. Each DSP 103a and 103b communicates with control unit 106. A single signal can be communicated to control unit 106 in one embodiment, for example if a comparison is conducted on-chip, such as is depicted in FIG. 1B and will be discussed in more detail below, or each DSP 103a and 103b can communicate separate signal(s) to control unit 106 in another embodiment.

Referring to either of FIG. 1A or 1B, secondary sensor 104 and its corresponding secondary signal path is generally one that, when compared with main sensor 102, is less accurate, slower and/or noisier; operates using different working principles; and/or includes additional secondary sensing tasks. Secondary sensor 104 can therefore be less expensive than main sensor 102 and may also have fewer restrictions on positioning, chip area and other factors that affect the cost and complexity of system 100. These secondary sensing tasks can include measurement of compensation signals, such as temperature, mechanical stress, internal operational or bias voltages, operational or bias currents, and/or additional, simpler target measurements. For example, sensors 102 and 104 comprise magnetic field sensors in an embodiment, and a target measurement of such sensors would be magnetic fields. In embodiments, however, secondary sensor 104 can comprise a plurality of sensors or a sensor array, such as a magnetic field sensor to mirror main sensor 102 as well as a temperature sensor and a stress sensor in one example embodiment.

In an embodiment, however, the secondary sensor and signal path can be used in a plausibility comparison with the main sensor and signal path. Further, the secondary sensor and signal path can be used for fault detection as well as verification of the main sensor and signal path. Several advantages can be provided by such a configuration. First, SIL compatibility can be achieved. Second, size and cost advantages can be realized as compared with conventional solutions, and self-testing can be carried out during normal operation without significant additional hardware. Further, additional self-testing features of the digital signal processing (DSP) and of the signal processing software can be implemented. Additionally, field failure and return rates can also be reduced, improving cost efficiencies on both sides, i.e., for the original chip manufacturer as well as the customer implementing the chip.

Figure 2:
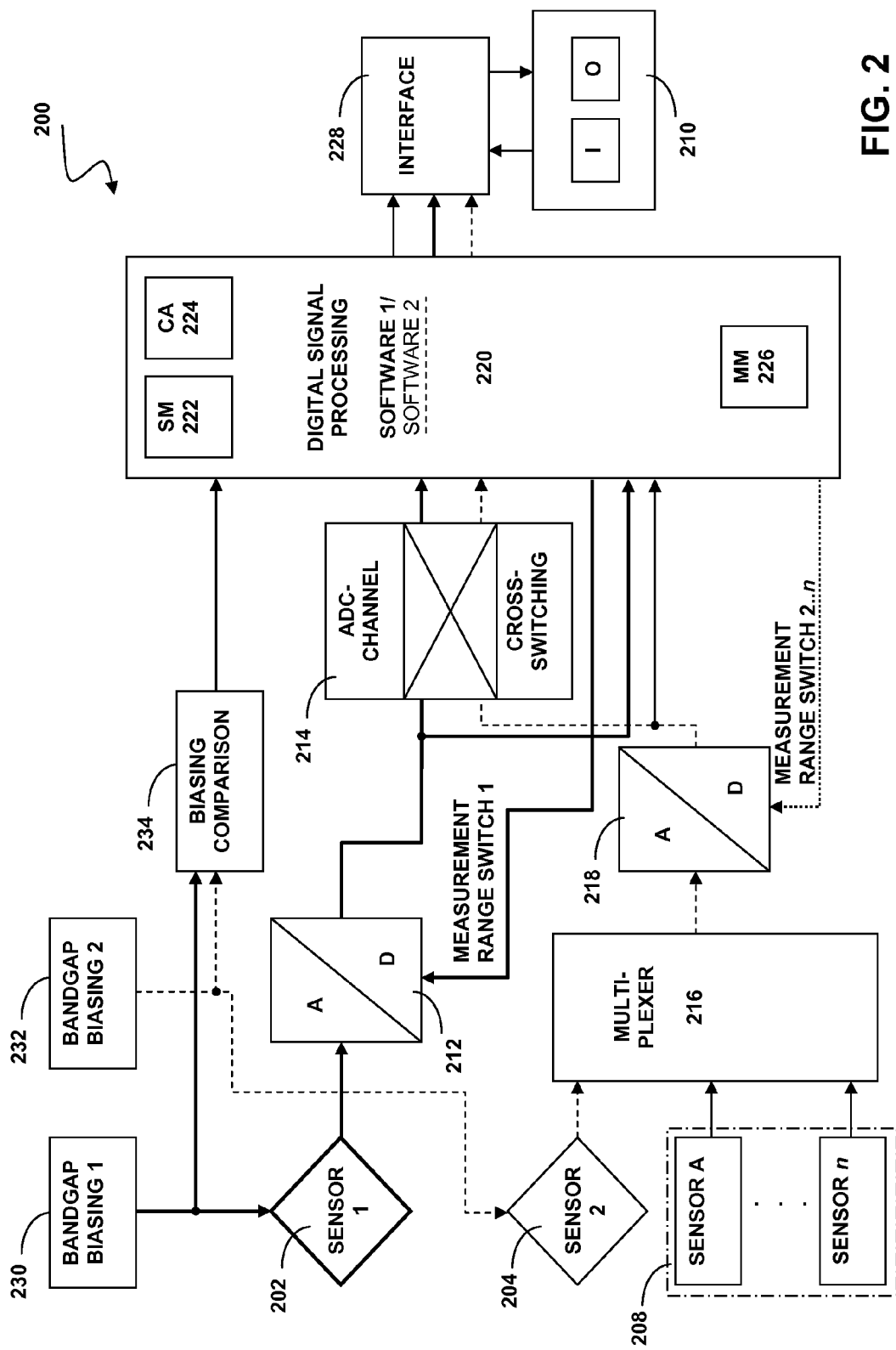
FIG. 2 depicts a system block diagram according to the embodiment of FIG. 1A.

Referring to FIG. 2, a block diagram of an embodiment of a sensor system 200 based on the concept depicted in FIG. 1A is depicted. System 200 includes a main magnetic field sensor 202 and a secondary magnetic field sensor 204, such as Hall effect or magneto-resistive (xMR, including GMR, AMR, TMR, etc.), though sensors 202 and 204 can be other types of sensors in other embodiments and are not limited to magnetic field sensors. Sensor 202 is similar conceptually to sensor 102, while sensor 204 is similar conceptually to sensor 104, discussed above with reference to FIGS. 1A and 1B.

System 200 also comprises one or more additional sensors 208, also considered secondary, auxiliary or ancillary sensors. Sensor(s) 208 can include temperature, stress, current, magnetic field or some other sensor format in various embodiments.

In an embodiment, main sensor 202 communicates with a digital signal processing (DSP) portion 220. DSP portion 220 can in turn communicate with an external ECU or other control unit (refer, for example, to FIG. 1A) via an input/output 210. According to an embodiment, sensors 202 and 204 communicate with DSP portion 220 via distinct signal paths, which can include structurally different analog signal paths, mixed signal paths and, to a certain extent, digital signal paths and processes, and software components. In FIG. 2, a main signal path associated with main sensor 202 is shown in bolded line, while a secondary signal path associated with sensor 204 is shown in simple dashed line.

For example, in the embodiment of FIG. 2, the main signal path can communicate a signal from main sensor 202 to an analog-to-digital (A/D) converter 212 and A/D conversion channel cross-switch 214. A secondary signal path communicates a signal from secondary sensor 204 to a multiplexer 216, which also receives as input(s) any signals from additional or ancillary sensors 208. The secondary signal path then continues from MUX 216 to a second A/D converter 218, which also sends its output to cross-switch 214.

In an embodiment, elements of the main signal path and elements of the secondary signal path are not identical and/or are implemented using different working principles. For example, A/D converter 212 in the main signal path can comprise a sigma-delta converter of the third order while A/D converter 218 in the secondary signal path can comprise a sigma-delta converter of the first order, or one or more of the A/D converters can utilize a successive approximation register (SAR) or flash technique instead of sigma-delta. In other words, as with secondary sensor 204 being generally one that, when compared with main sensor 102, is less accurate, slower and/or noisier, operates using different working principles, and/or includes additional secondary sensing tasks, the same can be true for A/D converter 218 when compared with A/D converter 212.

Outputs of cross-switch 214 are associated with both the main and secondary signal paths and are fed to a digital signal processing (DSP) portion 220. DSP 220 includes a state machine 222, a clamping algorithm 224 and a memory matrix 226 in an embodiment. Consistent with the main and secondary signal paths concept, DSP 220 also includes a first software portion associated with the main signal path and a second software portion associated with the secondary signal path. Additionally or alternatively, DSP 220 can also implement different DSP methodologies or techniques for the main signal path and the second signal path. In an embodiment, DSP 220 is coupled to I/O 210 via an interface 228, and I/O 210 is in turn coupled to an external ECU (not depicted in FIG. 2).

The main and secondary signal paths thereby can provide two different, quasi-redundant analog signal paths that provide numerous beneficial properties. For example, transmission of the main magnetic field signal from sensor 202 in a cycle via the main signal path can provide a highly precise computational result, wherein the main signal path itself operates very precisely, such as by using chopping or other techniques, and quickly, at least with respect to the secondary signal path. The main signal path also operates as independently and freely, without being influenced by other system components.

For analytic purposes, the secondary signal path also provides the possibility of providing its data to the control unit, where the data could be processed with either a positive or a negative sign. Possible parallel outputs from DSP 220 to interface 228 and I/O 210 are shown in system 200, while sequential transmissions could also be implemented, utilizing time-division multiplex or on demand as externally requested, for example.

Sensors 202 and 204 and optionally 208 can utilize different sensing principles with respect to their measured values, including processes, technological performance and specifications, size and/or placement of the sensors 202 and 204 themselves, and biasing. An embodiment of system 200 includes two bandgap biasing portions 230 and 232 and a biasing comparison 234. Biasing portion 230 is associated with the main signal path, and biasing portion 232 is associated with the secondary signal path. Biasing portions 230 and 232 provide the option of different biasing of sensors 102 and 104, respectively, while biasing comparison 234 can provide an output signal to DSP 220 for consideration.

Embodiments of system 200 can also utilize different A/D conversion and/or switching concepts, via A/D converters 212 and 218 and cross-switch 214. For example, as previously mentioned, A/D converter 212 in the main signal path can comprise a sigma-delta converter of the third order while A/D converter 218 in the secondary signal path can comprise a sigma-delta converter of the first order, or one or more the A/D converters can utilize a successive approximation register (SAR) or flash technique instead of sigma-delta. In various embodiments, these different A/D conversion and/or switching concepts can provide different fault behaviors and/or failure probabilities. Measurement ranges can also be switched in embodiments, via the noted inputs to A/D converters 212 and 218 in FIG. 2, in order to detect clamping or limiting effects.

Embodiments can also provide the option of switching the sensors 202 and 204 with their respective main and secondary signal paths. For example, secondary sensor 204 can be exchanged into the main signal path, and likewise with sensor 202 and the secondary signal path. This option can provide improved fault detection and/or locating by isolating a sensor from its path, for example. This switching also can be carried out for the embodiments of FIGS. 3 and 4, discussed herein below.

Another advantage presented by embodiments of system 200, as well as system 300 discussed herein below, is the ability to compare, such as by forming quotients, the output signals of each of the main and secondary signal paths and evaluate the result. The result can be evaluated to determine one or more aspects related to the performance or functioning of sensors 202 and 204, the signal paths, system 200 and/or some other component. For example, comparing the output signals can detect a rapid change in the input signal. In embodiments utilizing compensation, such as temperature compensation when sensor 208 comprises a temperature sensor, the output signals can be compared as a function of the temperature compensation signal. In other embodiments, clamping or limiting of information from sensors 208 can be implemented to isolate other signals, properties or information.

Because DSP 220 utilizes software 1 for the main signal path and software 2 for the secondary signal path, output results of the signal paths can be compared in embodiments. Such a comparison can provide a check of the software algorithms themselves. Internal or external window comparisons can also be used in plausibility checks of the two signal paths or computational results of DSP 220. As part of such a plausibility check, warning and/or failure thresholds can be implemented.

Figure 3:
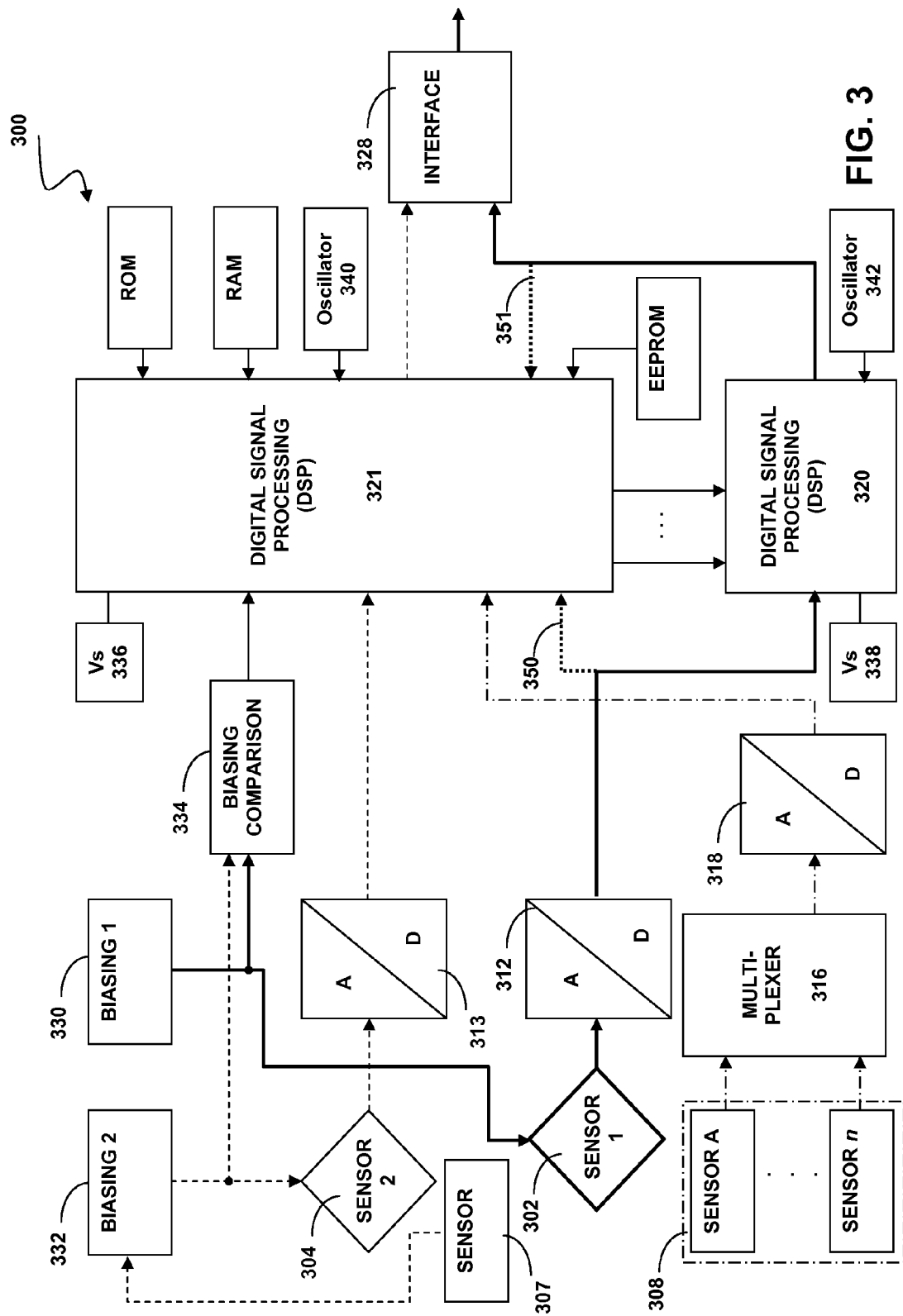
FIG. 3 depicts a system block diagram according to the embodiment of FIG. 1B.

In another embodiment, and referring to FIGS. 3 and 4, a system 300 similar to system 200 can comprise first and second DSPs 320 and 321, or other state machines or logic, and a different signal path configuration as compared with system 200. Components and features of system 300 are generally similar to those of system 200 discussed above unless otherwise specified herein.

Referring in particular to FIG. 3, system 300 comprises a main sensor 302 and a secondary sensor 304, which can be magnetic field sensors or some other sensor type(s) in various embodiments, consistent with other embodiments discussed herein. In embodiments, main sensor 302 and secondary sensor 304 sense the same physical characteristic. For example, in one embodiment both sensors 302 and 304 comprise magnetic field sensors. System 300 also can comprise one or more additional sensors 308, similar to sensor(s) 208 of system 200, which can comprise one or more temperature, stress, current, magnetic field (including Hall effect and/or magnetoresistive sensors) or some other sensor type or format in embodiments. In other embodiments, sensors 308 can be omitted. In embodiments, sensors 302 and 304 can vary from another with respect to number, type of sensing, geometry, size and/or some other characteristic.

Each of main sensor 302 and secondary sensor 304 communicates with and within system 300 via a distinct and diverse signal path. The path associated with main sensor 302 is depicted in bold lines in FIG. 3 and is generally of the highest resolution and accuracy of the three signal paths, while the path associated with secondary sensor 304 is depicted in simple dashed lines. As in the embodiment of FIG. 2, the implementation of these two different, distinct paths enables a plausibility comparison between the two, as sensors 302 and 304 typically are sensing the same physical quantity, and also provides similar or the same temporal resolution between the main and secondary signal paths. System 300 also comprises a third signal path associated with auxiliary sensor(s) 308 depicted in dot-and-dashed lines in FIG. 3. Auxiliary sensor(s) 308 typically are of a different type than sensors 302 and 304, such as non-magnetic physical variables which can be used to compensate the measurement signals of sensors 302 and 304 and their respective signal paths for temperature, mechanical stress, supply voltage, or other effects. Each signal path will be discussed in turn.

As discussed above with reference to FIG. 2, elements of the main, secondary and third signal paths are not identical and/or are implemented using different working principles in embodiments. For example, A/D converter 312 in the main signal path can comprise a sigma-delta converter of the third order while A/D converter 313 in the secondary signal path can comprise a sigma-delta converter of the first order, or one or more of the A/D converters can utilize a successive approximation register (SAR) or flash technique instead of sigma-delta. In other words, as with secondary sensor 304 being generally one that, when compared with main sensor 302, is less accurate, slower and/or noisier, operates using different working principles, and/or includes additional secondary sensing tasks, the same can be true for A/D converters 312, 313 and/or 318.

Referring first to main sensor 302 and its signal path, sensor 302 communicates with an A/D converter 312 and with a first DSP 320. As previously mentioned, system 300 comprises first and second DSPs 320 and 321, in contrast with the single DSP block 220 of system 200. The main signal path continues from DSP 320 to an output interface 328. Biasing circuitry 330 is coupled with sensor 302, which is also communicated to biasing comparison circuitry 334 and subsequently to DSP 321.

Secondary sensor 304 communicates with an A/D converter 313 and without an intervening multiplexer in an embodiment, as in system 200. Omitting a multiplexer from the secondary signal path in the embodiment of FIG. 3 can improve processing speed and the timing of signals within system 300. A/D converter 313 can be of a different type and/or filter architecture or vary in some other way from one or both of A/D converters 312 and 318 in embodiments and communicates with DSP 321, the other DSP than that which sensor 302 communicates. In other embodiments, DSPs 320 and 321 can be reversed, such that sensor 302 communicates with DSP 321 and sensor 304 communicates with DSP 320, and/or switching circuitry can be implemented in system 300 in order to switch DSPs 320 and 321 between various ones of the signal paths. DSPs 320 and 321 are depicted as being coupled in FIG. 3, for example to exchange data, status or other information, though in other embodiments these connections can be omitted. DSPs 320 and 321 are discussed in more detail below with additional reference to FIG. 4.

For further diversity between the main and secondary sensors 302 and 304 and corresponding signal paths, a sensor 307 can be coupled with the secondary signal path to provide, e.g., compensation. For example, in an embodiment sensor 307 comprises a stress sensor to provide stress compensation information to sensor 304 and the secondary signal path via biasing circuitry 332. Biasing circuitries 330 and 332 can be compared with one another by biasing comparison circuitry 334 and/or DSP 321 in order to detect a malfunction in one or the other, or both, and/or a deviation from a nominal value in embodiments. Based on information from sensor 307, a voltage, current or other characteristic related to sensor 304 can be adjusted in order to compensate for stress, temperature or other factors affecting the accuracy of sensor 304.

Moreover, further diversity can be provided between the main and secondary signal paths by providing analog compensation in one signal path and digital compensation in the other. For example, in system 300 biasing circuitry 332 can provide analog compensation in the secondary signal path by adjusting one or more characteristics related to sensor 304 based on analog information from sensor 307. Meanwhile, DSP 320 can provide digital post-compensation in the main signal path, for example by taking into consideration information from auxiliary sensors 308, which can be received from DSP 321 or in some other manner. The analog and digital compensations can be reversed, shared or otherwise coupled to or between the main signal path and secondary signal path in various embodiments. In general, however, a different compensation technique can be used in each signal path, such as an analog compensation technique in one signal path and a digital compensation technique in the other; or a first analog technique in one signal path and a second analog technique in the other signal path; or a first digital technique in one signal path and a second digital technique in the other signal path, in various example embodiments.

Auxiliary sensors 308 are coupled to multiplexer (MUX) 316 and subsequently to A/D converter 318 in an embodiment. In embodiments, such as one in which only a single auxiliary sensor 308 is present, MUX 316 can be omitted. A/D converter 318 communicates, via the third signal path, with DSP 321, or the same DSP 320 or 321 with which secondary sensor 304 communicates. As previously mentioned, diversity of signal paths can be provided, at least in part, by A/D converter 318 comprising a different architecture, resolution and/or type than one or both of A/D converters 312 and 313. This, however, can vary in other embodiments. For example, in another embodiment auxiliary sensors 308 are coupled, such as by a MUX, to one of the main or secondary signal paths. In example embodiment, A/D converter 318 can be omitted, with auxiliary sensors and main sensor 302 coupled to MUX 316, then A/D converter 312 and DSP 320. Or, secondary sensor 304 can be coupled with auxiliary sensors 308 to MUX 306, then A/D converter 313 and DSP 321. Other variations can be implemented as well, as appreciated by those skilled in the art.

In embodiments, DSP 320 and DSP 321 can be coupled to different supply voltages Vs 336 and Vs 338, respectively. More broadly, one or both of different analog power supplies for the main signal path and secondary signal path, and/or DSP 320 and DSP 321, can be implemented in embodiments to provide additional diversity and/or separation between the signal paths and/or circuit portions and components. For example, though not depicted in FIG. 3, a first analog power supply can be coupled to sensor 302 and/or the main signal path and a second analog power supply can be coupled to sensor 304 and/or the secondary signal path, in addition to Vs 336 and Vs 338 on the digital side. One of the first or second power supplies can also supply auxiliary sensors 308 and/or a third signal path, or a third analog power supply can be implemented, in various embodiments. In other embodiments, an analog supply is provided, and a digital supply is provided.

Additionally, DSP 320 can be coupled to a first oscillator 340 and DSP 321 can be coupled to a different, second oscillator 342 in an embodiment. In embodiments, oscillators 340 and 342 can be different or the same as one another, i.e., two separate devices but of the same type. In other embodiments, oscillators 340 and 342 are separate devices and comprise different types of oscillator devices. This can provide further diversity between the main and secondary signal paths and increase independence between DSP 320 and 321.

In another embodiment, DSP 321 can be used to conduct a recalculation or plausibility check of a calculation or other process of DSP 320, or vice-versa. In FIG. 1, this optional feature is illustrated by additional input signals to DSP 321: input signal 350 from A/D converter 312 to DSP 321, and input signal 351 from DSP 320 to DSP 321. Thus, DSP 321 can carry out the same calculation or process as DSP 320 using these signals 350 and 351, for example at the same or a lower data rate in one embodiment and/or in embodiments in which DSPs 320 and 321 are the same, similar or different from one another, to check whether DSP 320 is functioning properly. Rearranging or providing additional couplings can enable DSP 320 to check the functionality of DSP 321, instead of or in addition to the opposite configuration in various embodiments.

Though they can be identical in other embodiments, DSP 320 and DSP 321 themselves are not identical in the embodiments of FIGS. 3 and 4. Non-identical or diverse implementations of DSPs 320 and 321 can be advantageous in embodiments to reduce the risk of systematic faults related to development or other processes, which typically cannot be accounted for with the same or a similar probability when using two identical hardware implementations. While particular characteristics are discussed herein with respect to one or the other, those skilled in the art will appreciate that those characteristics can be reversed in other embodiments, or that still other configurations or characteristics can be present for one or both of DSP 320 and DSP 321 in other embodiments, which still providing signal processing and/or signal path diversity. In the embodiment of FIG. 3, DSP 320 can be of a higher resolution and/or be dedicated solely to the processing of the main signal path and information from main sensor 302, while DSP 321 can be larger and more complex but responsible for more information and the processing of the secondary and third signal paths. For example, in one embodiment DSP 320 can comprise a dedicated hardware block, with sequential running multiplication and subtraction/addition stages. Each DSP 320 and 321 can use different compensation methods and implement other distinctions in order to provide increased diversity between the main and secondary signal paths.

Referring, for example, to FIG. 4, one embodiment of an implementation of the two DSPs 320 and 321 is depicted. In the embodiment of FIG. 4, DSPs 320 and 321 are implemented as part of a single digital core 402, though in other embodiments each DSP 320 and 321 can comprise a separate digital core, with additional signal paths implemented as necessary. In general, including in ways depicted in FIG. 4 as well as others, DSP 320 and DSP 321 differ in their architectures to provide additional diversity between the main and secondary signal paths and such that the probability of the occurrence of systemic faults is reduced. Fault coverage also can be improved if a plausibility check or recalculation is performed in embodiments in which signals 350 and 351, or other similar signals, are provided to one or both of DSPs 321 and 320.

DSP 320 is coupled to the main signal path associated with main sensor 302 and receives as input a signal from A/D converter 312. DSP 321 is coupled to the secondary and third signal paths in an embodiment and receives as input a signal from A/D converter 313. As previously mentioned, DSP 320 and DSP 321 can be coupled with different signal paths, can be reversed, or otherwise can carry out different particular functions than are specifically depicted in embodiments. In an embodiment, DSP 320 comprises RAM 404 and an analog and/or digital hardware block 406 to implement one or more various functions, including compensation for offset, sensitivity, stress, temperature and/or other effects. For example, in embodiments RAM 404 of DSP 320 is coupled to RAM 408 of DSP 321 in order to receive data related to auxiliary sensors 308 for use in compensation calculations by RAM 404. This connection between RAM 404 and RAM 408 is optional in embodiments and can be eliminated in one embodiment, e.g., to improve diversity of the main and secondary signal paths. Analog and/or digital hardware block 406 can implement post-processing and other functions, including, e.g., linearization calculations and also can communicate with firmware 410 of DSP 321 in embodiments to exchange post-processing and other information, though as with the connection between RAM 404 and RAM 408, the connection between hardware block 406 and firmware 410 also can be optional in embodiments. In an embodiment, firmware 410 comprises a mask-programmable state machine or other suitable configuration.

Eliminating one or more of these connections in embodiments can make one or both of DSPs 320 and 321 more complex but also more diverse. For example, the connection between RAM 404 and RAM 408 can function to provide DSP 320 with compensation information from sensor(s) 308, where that information has been processed by DSP 321 prior to be communicated to DSP 320. Omitting the connection thus requires additional calculations and processing to be carried out by DSP 320 instead, though this can be advantageous in embodiments in which more complete diversity between the main and secondary signal paths is necessary or desired. With or without the connection(s) therebetween, DSPs 320 and 321 use different compensation methodologies and/or algorithms in embodiments to compensate for the influences of temperature, mechanical stress and other factors on sensors 302 and 304. For example, the algorithms for DSP 320 and DSP 321 can differ in terms of temporal sequence of calculations and/or the functionality used. In embodiments, the diverse functionalities can be achieved by using, e.g., polynomials having different mathematical orders. In embodiments, the complexity of one or both of the compensation algorithms can be reduced, or the algorithm can be eliminated entirely, if temperature, mechanical stress and other effects are themselves reduced or eliminated via analog circuitry implementations.

Signals from analog and/or digital hardware block 406 and firmware 410 are communicated to digital output interface 328, or to other circuitry before output interface 328 such that a comparison of the output signals of DSP 320 and DSP 321 can be carried out to detect a possible error in system 300. In another embodiment, a comparison of the output signals of DSP 320 and DSP 321 is carried out off-chip, such as within a control unit (e.g., control unit 106 of FIG. 1B). In yet another embodiment, a first comparison is carried out on-chip, and a second comparison is carried out off-chip in a control unit or by other circuitry, such that the first and second comparisons themselves can be compared.

In embodiments, the respective output signals from DSP 320 and DSP 321 should be the same or similar despite the diverse paths taken from each of sensors 302 and 304 to this point, and can be provided at the same time or close in time, such as within a few milliseconds of one another in an example embodiment. A difference between the two, such as a lack of identity or a variation greater than some percentage or value, such as greater than about 10 percent or about 20 percent in example embodiments, can indicate an error, malfunction or other problem. In embodiments, a comparison between the signals from DSP 320 and DSP 321 can be carried out on-chip, such as within or by output interface 328 or elsewhere within digital core 402, or the signals from each DSP 320 and 321 can be communicated external to the chip, for example to an engine control unit (ECU) or other controller, for comparison and/or other processing.

In embodiments comprising two DSPs 320 and 321, or in the embodiment of FIG. 2 comprising a single DSP 220, additional features and functions also can be implemented within each DSP itself. For example, protected memory and working register area can be provided by using additional security bits in the data signals, such as those according to parity logic, Hamming code and other suitable methodologies appreciated by those skilled in the art. Protected memory, working register area and signal buses also can be provided in an embodiment by using a forward error correction (FEC) block. Moreover, one or more of DSPs 220, 320 and 321 can use a redundant instruction decoder and/or control bus as well as a redundant instruction set and security bits, or by using an FEC block, or a redundant data path, such as via an arithmetic logic unit (ALU), and data bus, also protected by corresponding security bits or through use of an FEC block.

Embodiments can therefore provide safety standard compatibility as well as fault self-diagnostics in a sensor system. While the handling of faults can vary according to the type and severity as well as the particular system at issue and/or relevant safety standards, embodiments can provide opportunities to alert system users of detected issues. For example, in a safety-critical automotive electronic power steering sensor application utilizing magnetic field sensors, detected faults can lead an ECU to alert a driver of a critical system issue such that appropriate action can be taken. In certain applications, an ECU can be programmed to switch to a safe mode or secure operating protocol in an error fault situation.

Further, embodiments are more space- and cost-efficient than conventional solutions utilizing redundant primary sensors. For example, the main/secondary sensor and signal path can increase chip area by less than 10% in embodiments while utilizing only a single primary sensor, rather than two, with the secondary sensor typically being a less expensive device in view of the reduced demands on its performance. In view of the less expensive secondary sensor, advantages are also achieved over conventional solutions utilizing two primary sensors on a single chip.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A monolithic integrated circuit sensor system comprising:
   a first sensor device configured to sense a physical quantity and being coupled to a first signal path comprising a first digital signal processor (DSP) for a first sensor signal on a semiconductor chip, the first DSP providing a first output signal; and
   a second sensor device configured to sense the same physical quantity as the first sensor device and being coupled to a second signal path for a second sensor signal on the semiconductor chip, the second signal path separate and distinct from the first signal path and comprising a second DSP, the second DSP providing a second output signal,
   wherein a comparison of the first output signal and the second output signal indicates whether or not there is an error in the sensor system.

2. The sensor system of claim 1, wherein the comparison is carried out within the sensor system.

3. The sensor system of claim 1, wherein the comparison is carried out external to the sensor system.

4. The sensor system of claim 3, wherein the comparison is carried out by a control unit coupled to the sensor system.

5. The sensor system of claim 1, wherein at least one of an architecture or a function of the first DSP is different than an architecture or a function of the second DSP.

6. The sensor system of claim 1, wherein the first DSP communicates with the second DSP.

7. The sensor system of claim 1, wherein the first and second DSPs are coupled to the first and second signal paths, respectively, by first and second analog-to-digital (A/D) converters.

8. The sensor system of claim 7, wherein the first A/D converter is different from the second A/D converter.

9. The sensor system of claim 1, further comprising at least one additional sensor device.

10. The sensor system of claim 9, wherein the at least one additional sensor device forms part of a third signal path at least partially distinct from the first and second signal paths.

11. The sensor system of claim 9, wherein the at least one additional sensor device is coupled to one of the first signal path or the second signal path by a multiplexer.

12. The sensor system of claim 9, wherein the at least one additional sensor device is selected from the group consisting of a temperature sensor, a stress sensor, a current sensor, a voltage sensor and a magnetic field sensor.

13. The sensor system of claim 1, wherein the first and second sensor devices comprise magnetic field sensors.

14. The sensor system of claim 1, further comprising a compensation sensor device coupled to one of the first signal path or the second signal path to provide an analog compensation signal thereto, and wherein the other of the first signal path or the second signal path is configured to receive a different compensation signal.

15. The sensor system of claim 14, wherein the different compensation signal comprises a digital compensation signal.

16. The sensor system of claim 1, wherein the first signal path, when compared with the second signal path, has at least one characteristic selected from the group consisting of being faster, being more precise, having less noise and having a different working principle.

17. The sensor system of claim 1, further comprising a first power supply coupled to the first signal path and a second power supply coupled to the second signal path.

18. The sensor system of claim 1, further comprising a first power supply coupled to the first DSP and a second power supply coupled to the second DSP.

19. The sensor system of claim 1, further comprising a first oscillator device coupled to the first DSP and a second oscillator device coupled to the second DSP.

20. A method of comparing signals in a monolithic integrated circuit sensor system comprising:
implementing, on a single semiconductor chip, a main signal path comprising a main sensor and a first digital signal processor (DSP);
implementing, on the single semiconductor chip, a secondary signal path comprising a secondary sensor and a second DSP, the main and secondary sensors being responsive to the same physical quantity, the secondary signal path being separate and distinct from the main signal path, and the second DSP being different from the first DSP by at least one of an architecture or a function; and
comparing an output signal of the first DSP with an output signal of the second DSP.

21. The method of claim 20, further comprising implementing, on the single semiconductor chip, at least one auxiliary sensor and a third signal path, the third signal path being at least partially distinct from each of the main and secondary signal paths.

22. The method of claim 21, further comprising compensating at least one of a signal of the main signal path or a signal of the secondary signal path by a signal of the third signal path.

23. The method of claim 22, further comprising compensating the other of the signal of the main signal path or the signal of the secondary signal path by a digital compensation signal.

24. The method of claim 20, further comprising:
implementing a first analog-to-digital (A/D) conversion technique on the main signal path; and
implementing a second A/D conversion technique on the secondary signal path, the first and second A/D conversion techniques being different from one another.

25. The method of claim 20, further comprising:
implementing a first algorithm by the first DSP; and
implementing a second algorithm by the second DSP, the second algorithm being different from the first algorithm.

26. The method of claim 25, wherein the second algorithm is different from the first algorithm according to at least one of a temporal sequence of operations, a function carried out, or a compensation technique applied.

27. The method of claim 24, further comprising providing protected circuitry by implementing security bits in at least one of the first DSP or the second DSP.

28. The method of claim 26, wherein the protected circuitry comprises at least one of a memory circuit, a register area, a control bus, a signal bus, a data bus or a data path.

29. The method of claim 24, wherein at least one of the first DSP or the second DSP comprises a forward error correction (FEC) block.

30. The method of claim 20, further comprising exchanging the main sensor and the secondary sensor such that the main sensor is coupled to the second DSP and the secondary sensor is coupled to the first DSP.

31. The method of claim 20, further comprising conducting a plausibility check of the first or second DSP by the other of the second or first DSP.

32. The method of claim 31, wherein conducting a plausibility check further comprises conducting the plausibility check using at least one of a lower data rate or a different DSP implementation between the first and second DSPs.

* * * * *